United States Patent
Seol et al.

(10) Patent No.: US 8,000,150 B2
(45) Date of Patent: Aug. 16, 2011

(54) METHOD OF PROGRAMMING MEMORY DEVICE

(75) Inventors: Kwang-soo Seol, Suwon-si (KR); Sang-jin Park, Pyeongtaek-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 433 days.

(21) Appl. No.: 12/213,323

(22) Filed: Jun. 18, 2008

(65) Prior Publication Data

US 2008/0316820 A1  Dec. 25, 2008

(30) Foreign Application Priority Data

Jun. 19, 2007  (KR) .................. 10-2007-0060052
May 16, 2008  (KR) .................. 10-2008-0045520

(51) Int. Cl.
*G11C 11/34* (2006.01)
(52) U.S. Cl. .......... 365/185.22; 365/185.18; 365/185.19
(58) Field of Classification Search .............. 365/185.18, 365/185.19, 185.22
See application file for complete search history.

(56) References Cited

U.S. PATENT DOCUMENTS

| | | | | |
|---|---|---|---|---|
| 6,459,621 B1 * | 10/2002 | Kawahara et al. | ....... | 365/185.24 |
| 6,829,172 B2 * | 12/2004 | Bloom et al. | ............ | 365/185.22 |
| 7,023,730 B2 * | 4/2006 | Kouno | ..................... | 365/185.12 |
| 7,023,733 B2 * | 4/2006 | Guterman et al. | ....... | 365/185.17 |
| 7,088,621 B2 * | 8/2006 | Guterman et al. | ....... | 365/185.18 |

* cited by examiner

*Primary Examiner* — Pho M Luu
*Assistant Examiner* — Tha-O Bui
(74) *Attorney, Agent, or Firm* — Harness, Dickey & Pierce, PLC

(57) ABSTRACT

A method of programming a memory device may include applying a program voltage to a memory cell of the memory device and consecutively applying a plurality of verifying voltages to the memory cell. The verifying voltages may be consecutively applied with a same voltage magnitude after applying the program voltage. The verifying voltages may be consecutively applied with sequentially decreasing magnitudes after applying the program voltage.

19 Claims, 12 Drawing Sheets

METHOD OF PROGRAMMING MEMORY DEVICE

PRIORITY STATEMENT

This application claims the benefit of priority to Korean Patent Application Nos. 10-2007-0060052 and 10-2008-0045520, respectively filed on Jun. 19, 2007 and May 16, 2008, in the Korean Intellectual Property Office, the entire contents of which are incorporated herein in their entirety by reference.

BACKGROUND

1. Field

Example embodiments relate to a method of programming a flash memory device, and for example, to a method of programming a flash memory device to more efficiently reduce threshold voltage dispersion in a programming state.

2. Description of Related Art

Floating gate type flash memories are commonly used as larger capacity non-volatile memories. In order to operate, the floating gate type flash memories store charges in floating gates formed of polysilicon.

A memory cell of a floating gate type flash memory may be classified into a single level cell (SLC) in which two recording states "1" and "0" are recorded and a multi-level cell (MLC) in which four or more recording states, e.g., "11," "10," "01," and "00," are recorded.

MLC technology is used to make NAND and NOR type flash memories of larger capacity.

In a MLC operation, dispersion of threshold voltages $V_{th}$ of cells respectively corresponding to recording states must be relatively lower to separately recognize the recording states.

A flash memory device may use an Incremental Step Pulse Programming (ISPP) method of uniformly increasing a program voltage $V_{pgm}$ and repeatedly applying the increased program voltage to reduce the threshold voltage dispersion between cells.

As is well known, in the ISPP method, program voltage pulses are applied with a progressive magnitude increase of $\Delta Vpgm$. A process of applying verifying voltage pulses to verify a threshold voltage of a memory cell is repeated to allow the threshold voltage of the memory cell to reach a desired, or alternatively, a predetermined value. A plurality of memory cells constituting a flash memory may have an initial threshold voltage dispersion. Therefore, the ISPP method has been introduced to allow the plurality of memory cells to reach desired, or alternatively, predetermined threshold voltages in consideration of the initial threshold voltage dispersion of the memory cells.

However, coupling between cells, for example, coupling between floating gates, increases with reductions in sizes of cells of a flash memory using a floating gate. Therefore, controlling the dispersion of a threshold voltage is more difficult.

In order to reduce the coupling between cells, charge trap flash (CTF) memories, which use insulating layers trapping charges instead of floating gates, e.g., $Si_3N_4$ layers configured to store charges, have been developed.

However, in a CTF memory which uses an insulating layer to trap chargers, after programming is performed, charges trapped in a charge trap layer migrate. Therefore, a threshold voltage value varies with time after programming is performed.

The variation of the threshold voltage value with time makes control of the dispersion of the threshold voltage value more difficult if programming is performed using the ISPP method.

If a threshold voltage varies with time as described above, an error occurs in an operation of performing programming and verifying a programmed state after a desired, or alternatively, a predetermined time elapses.

The dispersion of a threshold voltage value in a programming state in the ISPP method increases due to the verifying error.

For example, if the threshold voltage varies with time, the threshold voltage may reach a target value after further time elapses. However, even in this case, an error of verifying that a memory cell has not reached a target threshold voltage may occur. If the memory cell is verified to have not reached the target threshold voltage, a program voltage increased by $\Delta Vpgm$ is applied to program the memory cell. Therefore, an over program in which the threshold voltage increases occurs. Accordingly, dispersion of the threshold voltage in the programming state increases.

SUMMARY

Example embodiments provide a method of programming a memory device, the method comprising: performing a program voltage applying operation; and performing a verifying operation, wherein a plurality of verifying operations are consecutively performed after a program voltage applying operation.

According to an example embodiment, a pair of operations including one-time voltage applying operation and a plurality of verifying operations may be repeatedly performed with a progressive increase in a magnitude of a program voltage until a memory cell reaches a set threshold voltage.

According to an example embodiment, magnitudes of a verifying voltage used when the plurality of verifying operations are consecutively performed may be the same.

According to an example embodiment, magnitudes of a verifying voltage used when the plurality of verifying operations are consecutively performed may be sequentially decreased.

According to an example embodiment, the verifying voltage may be progressively decreased by a same magnitude.

According to an example embodiment, the verifying voltage may be progressively decreased by about 0.05V to 0.35V.

According to an example embodiment, the memory cell may be one of a floating gate type memory cell and a charge trap type memory cell.

According to an example embodiment, the plurality of verifying operations may be performed at intervals.

According to an example embodiment, the intervals may be within a range between about 1 μs and 100 μs.

According to an example embodiment, the method may further comprise: performing a first programming operation including a verifying operation using a first verifying voltage; and performing a second programming operation including a verifying operation using a second verifying voltage that is greater than the first verifying voltage wherein a plurality of verifying operations per one-time program voltage applying operation are consecutively performed after a program voltage is applied to the memory cell, wherein, in the first programming operation, a pair of operations including one-time program voltage applying operation and one-time verifying operation is repeatedly performed until the verifying operation using the first verifying voltage is passed, and in the second programming operation, a pair of operations including one-time program voltage applying operation and a plurality of verifying operations is repeatedly performed until the verifying operation using the second verifying voltage is passed.

According to an example embodiment, the first verifying voltage may be lower than the second verifying voltage within a range between about 0.2V and 1.0V.

According to an example embodiment, the second programming operation may be performed on a memory cell that passes the verifying operation using the first verifying voltage.

According to an example embodiment, the first programming operation may be performed on a memory cell in an erase state such that the memory cell in the erase state is programmed to an intermediate program state, and the second programming operation may be performed on the memory cell in the intermediate program state such that the memory cell in the intermediate program state is programmed to a final program state.

According to an example embodiment, the memory cell after the final program state may comprise three or more levels.

According to an example embodiment, the first programming operation may be performed on a memory cell in an erase state such that the memory cell in the erase state is programmed to an intermediate program state, and the second programming operation may be performed on the memory cell in the intermediate program state such that the memory cell in the intermediate program state is programmed to a final program state to increase a minimum threshold voltage of the intermediate program state and reduce a threshold voltage distribution range.

According to an example embodiment, the memory cell may be a 4-level cell, the erase state may be a "11" state, and the final program state may be at least one of a "01" state, a "00" state, and a "10" state.

According to an example embodiment, in each of the first programming operation and the second programming operation, a pair of operations including a program voltage applying operation and a verifying operation may be repeatedly performed with a progressive increase in a program voltage.

According to an example embodiment, a program voltage increment in each step in the second programming operation may be lower than that in the first programming operation.

According to an example embodiment, the method may further comprise performing a third programming operation including a verifying operation using a verifying voltage that is lower than the first verifying voltage, in which a pair of operations including one-time program voltage applying operation and one-time verifying operation is repeatedly performed on a memory cell in an erase state until the verifying operation using the verifying voltage lower than the first verifying voltage is passed such that the memory cell in the erase state is programmed to an intermediate program state, wherein the first programming operation and the second programming operation are sequentially applied to the memory cell in the intermediate program state such that the memory cell in the intermediate program state is programmed to a final program state to increase a minimum threshold voltage of the program state and reduce a threshold voltage distribution range.

According to an example embodiment, in each of the third programming operation, the first programming operation, and the second programming operation, a pair of operations including a program voltage applying operation and a verifying operation may be repeatedly performed with a progressive increase in a program voltage.

According to an example embodiment, a program voltage increment in each step in the second programming operation may be lower than that in the first programming operation.

According to an example embodiment, the memory cell may be a 4-level cell, the erase state may be a "11" state, and the intermediate program state may be at least one of a "01" state, a "00" state, and a "10" state.

According to an example embodiment, the first programming operation may be applied to a memory cell in an erase state such that the memory cell in the erase state is programmed to an intermediate program state that is a dummy state, the second programming operation may be applied to the memory cell in the erase state such that the memory cell in the erase state is programmed to a first program state, and the second programming operation may be applied to the memory cell in the dummy state such that the memory cell in the dummy state is programmed to a second or third program state.

According to an example embodiment, the memory cell may be a 4-level cell, the erase state may be a "11" state, and the first through third program states may be a "01" state, a "00" state, and a "10" state and are different from one another.

According to an example embodiment, in each of the first programming operation and the second programming operation, a pair of operations including a program voltage applying operation and a verifying operation may be repeatedly performed with a progressive increase in a magnitude of a program voltage.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
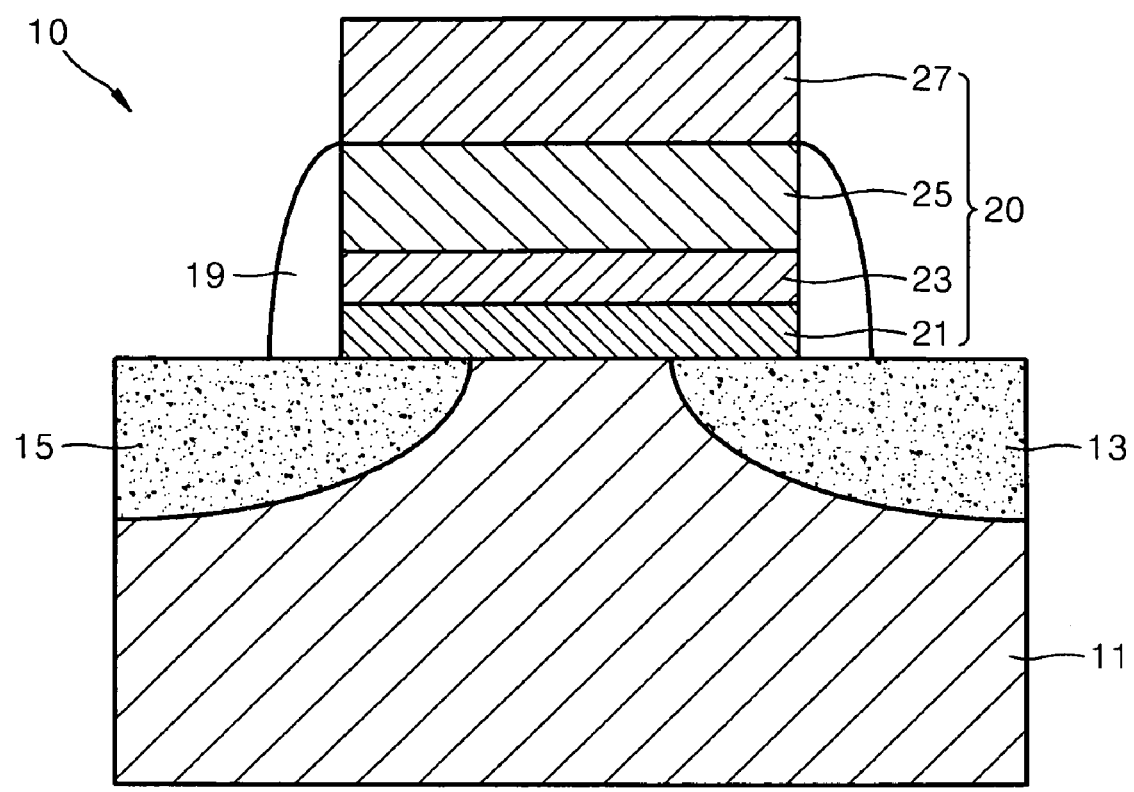
FIG. 1 is a schematic cross-sectional view of a charge trap flash (CTF) memory device in which a programming operation is performed using a programming method according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a schematic cross-sectional view of a charge trap flash (CTF) memory device in which a programming operation may be performed using a programming method of an example embodiment. The CTF memory device may constitute a memory cell of a CTF memory.

Referring to FIG. 1, a CTF memory device 10 may include a substrate 11 and/or a gate structure 20 formed on the substrate 11.

First and second impurity regions 13 and 15, which are doped with a desired, or alternatively, a predetermined conductive dopant, may be formed in the substrate 11. One of the first and second impurity regions 13 and 15 may be used as a drain D, and the other one of the first and second impurity regions 13 and 15 may be used as a source S.

The gate structure 20 may include a tunnel insulating layer 21 formed on the substrate 11, a charge trap layer 23 formed on the tunnel insulating layer 21, and/or a blocking insulating layer 25 formed on the charge trap layer 23. A control gate 27 may be formed on the blocking insulating layer 25. Reference numeral 19 of FIG. 1 denotes a spacer, which may be formed on sidewalls of the block insulating layer 25, the charge trap layer 23, and/or the tunneling layer 21.

The tunnel insulating layer 21 may be a layer for tunneling charges and/or may be formed on the substrate 11 to contact the first and second impurity regions 13 and 15. The tunnel insulating layer 21 may be formed of a tunneling oxide layer, e.g., $SiO_2$, various high-k oxides, or a combination of a tunneling oxide layer and various high-k oxides.

Alternatively, the tunnel insulating layer 21 may be formed of a silicon nitride layer, e.g., $Si_3N_4$. For example, the silicon nitride layer may be formed such that a density of an impurity is relatively lower (e.g., the density of the impurity in the silicon nitride may be comparable to that of a silicon oxide layer) and an interference characteristic with silicon is better.

The tunnel insulating layer 21 may be formed as a dual layer including a silicon nitride layer and an oxide layer.

The tunnel insulating layer 21 may be formed of oxide or nitride in a single layer structure or may be formed of materials having different energy band gaps in a multilayer structure.

The charge trap layer 23 may be an area in which charges are trapped to store information. The charge trap layer 23 may be formed to include one of polysilicon, nitride, a high-k dielectric, and nanodots.

For example, the charge trap layer 23 may be formed of a nitride, e.g., $Si_3N_4$ or high-k oxide, e.g., $HfO_2$, $ZrO_2$, $Al_2O_3$, HfSiON, HfON, or HfAlO.

The charge trap layer 23 may include a plurality of nanodots which are inconsecutively disposed as charge trap sites. For example, the nanodots may be nanocrystals.

The blocking insulating layer 25 may prevent charges from transferring upward toward the control gate 27 by passing through a position in which the charge trap layer 23 is formed. The blocking insulating layer 25 may be formed of an oxide layer.

The blocking insulating layer 25 may be formed of $SiO_2$ or a high-k material having a higher dielectric constant than the tunnel insulating layer 21, e.g., $Si_3N_4$, $Al_2O_3$, $HfO_2$, $Ta_2O_5$, or $ZrO_2$. The blocking insulating layer 25 may be formed in a multilayer structure. For example, the blocking insulating layer 25 may include two or more layers, e.g., an insulating layer formed of a general insulating material e.g., $SiO_2$, and a high-k dielectric layer formed of a material having a higher dielectric constant than the tunnel insulating layer 21.

The control gate 27 may be formed of a metal layer. For example, the control gate 27 may be formed of aluminum (Al). Alternatively, the control gate 27 may be formed of metal, e.g., Ru or TaN, or a silicide material, e.g., NiSi or the like. The metal and the silicide material may be generally used for forming a control gate of a semiconductor memory device.

A program may be performed to inject electrons into a CTF memory device as described above and trap the electrons in a trap site of the charge trap layer 23, such that the CTF memory device has a threshold voltage in a programming state. An erase may be performed to inject holes into the CTF memory device to re-combine the holes with electrons to erase the electrons, such that the CTF memory device has a threshold voltage in an erase state.

Accordingly, a memory cell of a flash memory device may have two states, e.g., program and erase states. An on state may be referred to as the erase state, and an off state may be referred to as the program state. In the on state, a threshold voltage of a flash memory cell may decrease to allow a current to flow into a drain connected to a bit line using a voltage applied to a control gate during reading. In the off state, the threshold voltage of the flash memory cell may increase to disallow the current to flow into the drain using the voltage applied to the control gate during reading.

The programming method of an example embodiment may be applied to program a CTF memory which uses a CTF memory device as described above as a memory cell.

The programming method of an example embodiment may be applied to program a floating gate type flash memory which uses a floating gate type flash memory device including a floating gate and a control gate as a memory cell. The floating gate type flash memory device is well known, and therefore, detailed illustrations and descriptions of the floating gate type flash memory device will be omitted herein.

Figure 2:
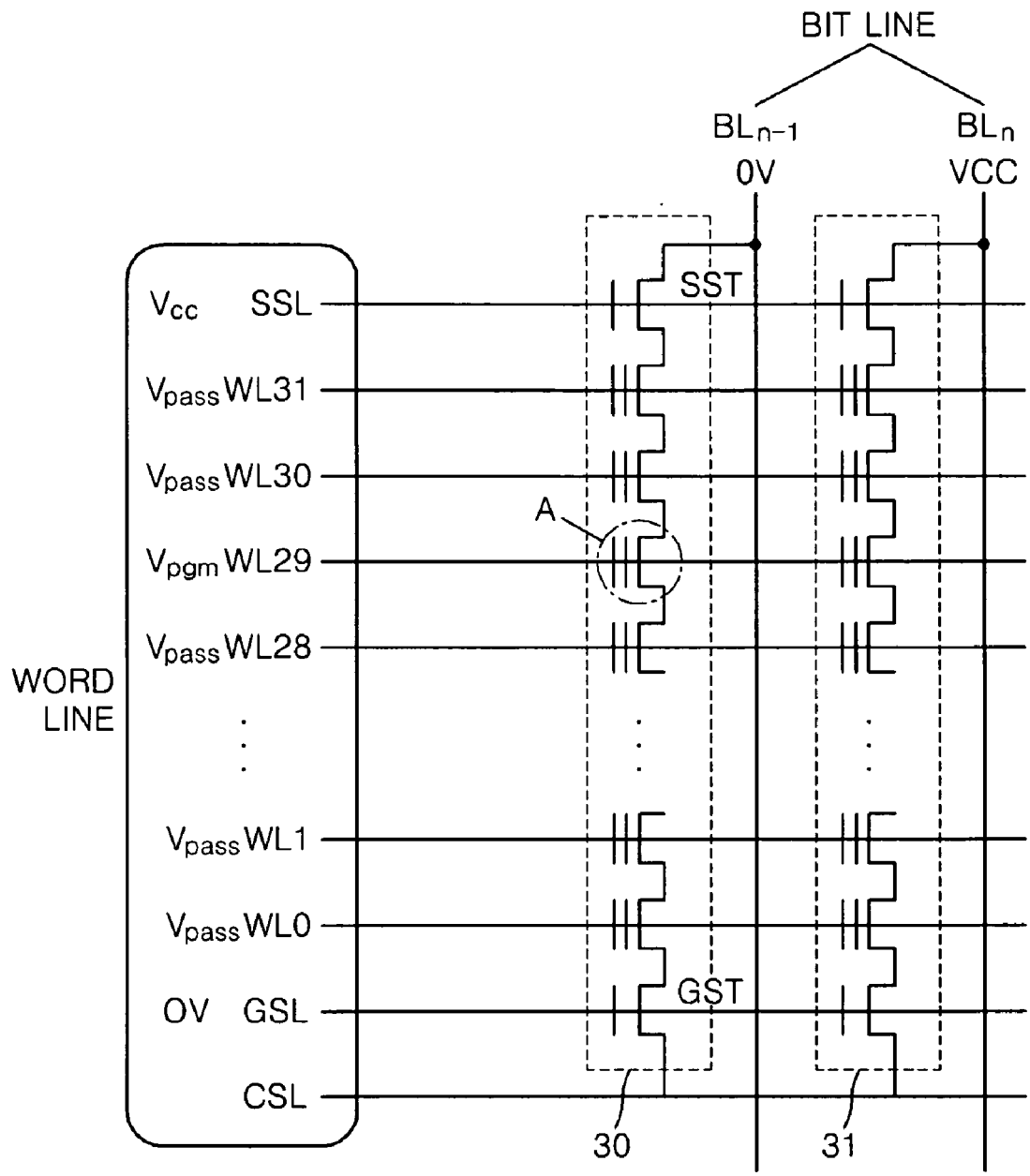
FIG. 2 is a circuit diagram of an NAND type flash memory as an example of a flash memory adopting the programming method of an example embodiment.

FIG. 2 is a circuit diagram of an NAND type flash memory as an example of a flash memory using the programming method of an example embodiment. Referring to FIG. 2, the flash memory may include a plurality of cell strings. However, only two cell strings 30 and 31 are exemplarily illustrated in FIG. 2.

Each of the cell strings 30 and 31 may include a plurality of memory cell arrays which share a source and drain with adjacent memory cells. Each of the memory cells of each of the cell strings 30 and 31 may have a structure as illustrated in FIG. 1. Each of the memory cells may be one of a CTF memory cell and a floating gate type flash memory cell as described above.

Each of the cell strings 30 and 31 may include a ground selection transistor (GST), a plurality of memory cells, and/or a string selection transistor (SST) connected to one another in series. An end of each of the cell strings 30 and 31 may be connected to a bit line BL, and the other end of each of the cell strings 20 and 31 may be connected to a common source line (CSL). The GSTs may be connected to the CSL, and the SSTs may be connected to the bit line BL.

Word lines (WLs) may be connected to control gates of the plurality of memory cells to cross the cell strings 30 and 31, string selection lines (SSLs) may be connected to gates of the SSTs, and/or ground selection lines (GSLs) may be connected to gates of the GSTs.

Data programmed in the memory cells may vary according to voltages of the bit lines BL. If the voltages of the bit lines BL are power supply voltages Vcc, the data may be inhibited from being programmed in the memory cells. If the voltages of the bit lines are ground voltages 0V, the data may be programmed in the memory cells. FIG. 2 illustrates an operation state in which a ground voltage 0V is supplied to a bit line $BL_{n-1}$, and a power supply voltage Vcc is supplied to a bit line $BL_n$.

In a programming operation, a program voltage $V_{pgm}$ may be applied to a selected WL, e.g., a WL WL29. A pass voltage $V_{pass}$ may be applied to unselected WLs, e.g., WLs WL31, WL30, WL28, ..., and WL0. A voltage, which progressively increases from a basic voltage of about 16V by about 0.5V increments, may be applied as the program voltage $V_{pgm}$, and/or a voltage of about 9V may be applied as the pass voltage $V_{pass}$.

A memory cell corresponding to the bit line $BL_{n-1}$ supplied with the ground voltage 0V may be programmed on the selected WL WL29. In FIG. 2, a memory cell A is programmed.

Figure 3:
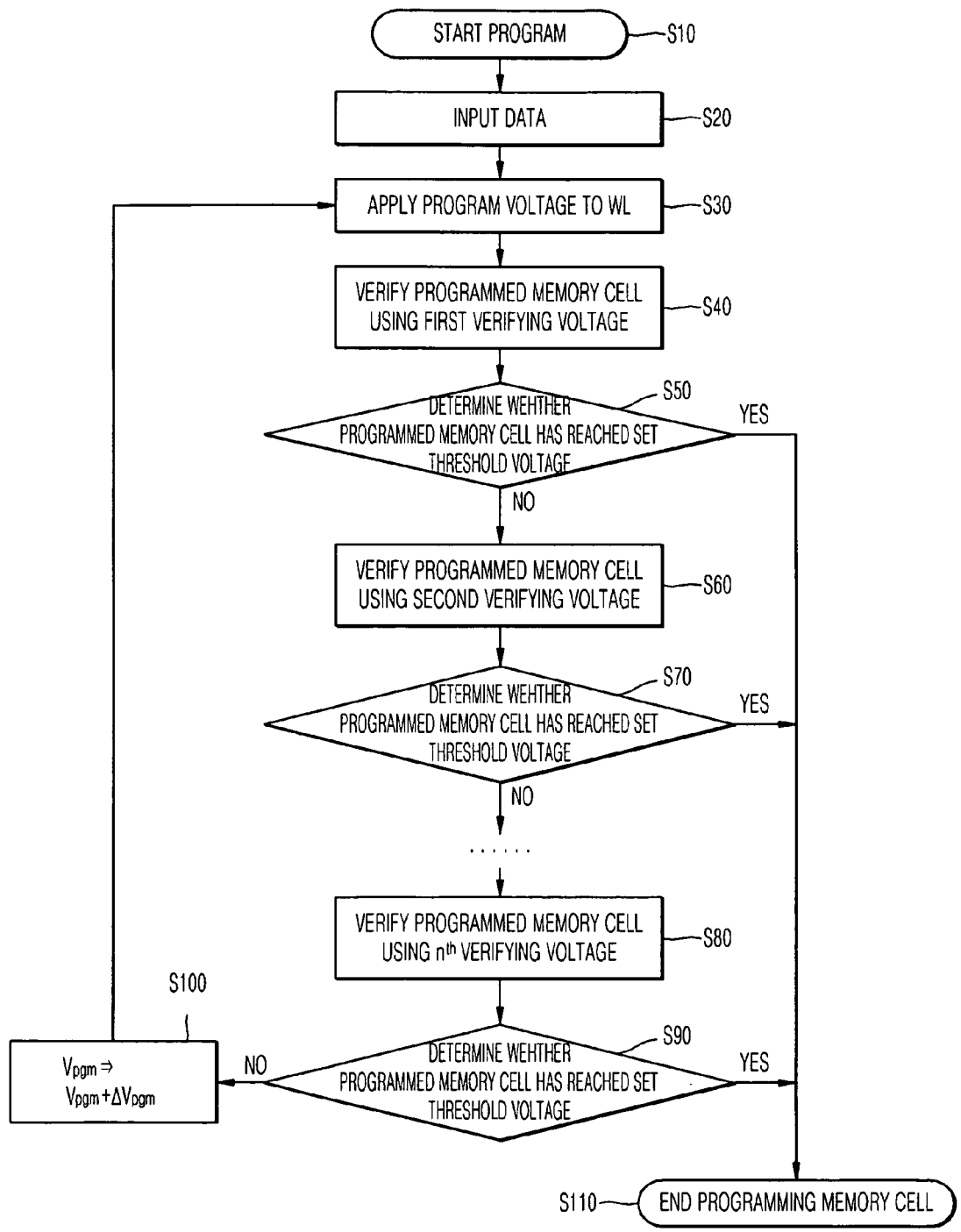
FIG. 3 is a flowchart of a programming operation of a programming method according to an example embodiment.
Figure 4:
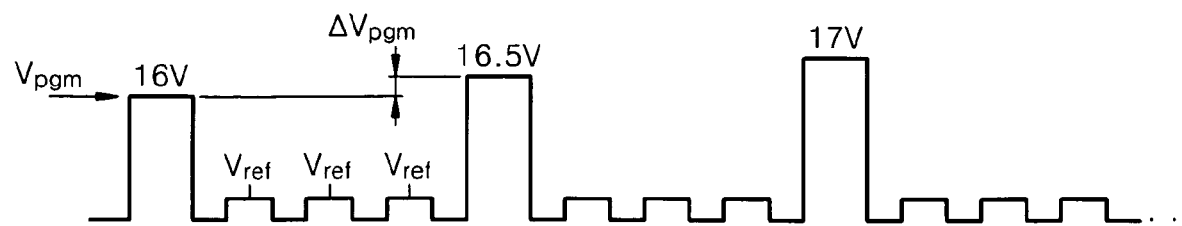
FIGS. 4 and 5 illustrate example waveforms of voltage pulses applied in the programming method of FIG. 3, according to example embodiments.
Figure 5:
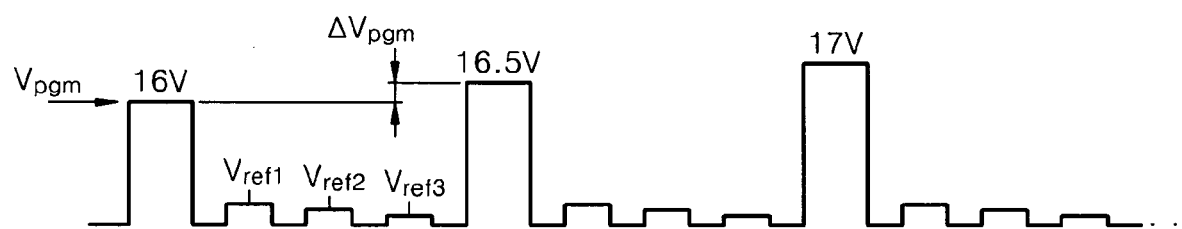

A method of programming a flash memory device according to an example embodiment is illustrated in FIG. 3, and example waveforms of voltage pulses applied to a WL selected during programming are illustrated in FIGS. 4 and 5. FIG. 4 illustrates a verifying voltage $V_{ref}$ which has a constant magnitude and is applied three times between program voltages having progressively increasing magnitudes, according to an example embodiment. FIG. 5 illustrates a verifying voltage which has a progressively decreasing magnitude and is applied three times between progressively increasing program voltages.

The programming method according to an example embodiment may include applying a program voltage $V_{pgm}$ to a selected WL, e.g., the WL WL29, programming a memory cell, and/or verifying the programmed memory cell.

According to an example embodiment, the programming method may be performed using an ISPP method of programming with a progressive increase in a magnitude of a program voltage as shown in FIGS. 4 and 5.

A program voltage applying operation and a verifying operation may be repeatedly performed with a progressive increase in a magnitude of the program voltage until a memory cell to be programmed, e.g., the memory cell A of FIG. 2, reaches a set threshold voltage.

The verifying operation of the programming method according to an example embodiment may be performed as follows. In the verifying operation, a verifying voltage may be applied to the programmed memory cell by applying the program voltage $V_{pgm}$ to verify the programmed memory cell. If the programmed memory cell is determined to have not reached the set threshold voltage, according to the result of the verifying operation, the verifying voltage is re-applied to re-verify the programmed memory cell. Reaching the set threshold voltage means that a threshold voltage is equal to or exceeds the set threshold voltage.

As described above, a programming method of an example embodiment may include a verifying operation performed after applying a program voltage pulse by sequentially applying verifying voltage pulses a plurality of times.

A maximum number of verifying operations performed per one-time program voltage applying operation may be n (where n is a number equal to or greater than "2") times. If the programmed memory cell is determined to have reached the set threshold voltage during the verifying operations up to n times, programming the memory cell ends. If through the n-times verifying operation the programmed memory cell is determined to have not reached the set threshold voltage, a program voltage increased by ΔVpgm may be re-applied to repeat the programming and verifying operations.

A pair including a program voltage applying operation and a plurality of verifying operations may be repeated with a progressive increase in a program voltage until the selected memory cell reaches the set threshold voltage.

In FIGS. 4 and 5, an example basic program voltage of 16V progressively increases by 0.5V to perform the programming operation.

If an ISPP method is applied, there is a relatively smaller possibility that a memory cell may reach a set threshold voltage through a one-time program voltage applying operation. Therefore, a process including applying the program voltage to program the memory cell and sequentially applying a verifying voltage to the programmed memory cell at least two times to verify the programmed memory cell may be performed at least one or more times in a program scheme for each memory cell.

A programming process of the programming method according to an example embodiment will now be described in more detail with reference to FIG. 3.

In operation S10, a program mode may start. In operation S20, data may be input to select a specific WL, e.g., the WL WL29.

In operation S30, a program voltage $V_{pgm}$ may be applied to the selected WL. The memory cell A corresponding to a bit line, which is connected to the selected WL and supplied with a ground voltage, may be programmed.

A verifying voltage may be applied to the selected WL to verify the programmed memory cell A.

For example, in operation S40, a first verifying voltage may be applied to the programmed memory cell A to verify the programmed memory cell A. In operation S50, a determination may be made as to whether the programmed memory cell A has reached a set threshold voltage.

If, in operation S50, the programmed memory cell A is determined to have reached the set threshold voltage and is therefore programmed to a desired or alternatively, a predetermined level, in operation S110, programming the memory cell A may end. If, in operation S50, the programmed memory cell A is determined to have not reached the set threshold voltage, in operation S60, a second verifying voltage may be applied to re-verify the programmed memory cell A. In operation S70, a determination may be made as to whether the programmed memory cell A has reached the set threshold voltage.

If, in operation S70, the programmed memory cell A is determined to have reached the set threshold voltage, in operation S100, programming the memory cell A may end.

If, in operation S70, the programmed memory cell A is determined to have not reached the set threshold voltage, a verifying voltage may be re-applied to re-verify the programmed memory cell A.

If none of the verifying operations determine that the programmed memory cell A has reached the set threshold voltage, the process is performed up to a verifying operation using an $n^{th}$ verifying voltage. In operation S80, the $n^{th}$ verifying voltage is applied to re-verify the programmed memory cell A. In operation S90, a determination is made as to whether the programmed memory cell A has reached the set threshold voltage.

If, in operation S90, the programmed memory cell A is determined to have not reached the set threshold voltage, in operation S100, a program voltage $V_{pgm}$ may be increased by ΔVpgm. In operation S30, the increased program voltage $V_{pgm}$ may be applied to the selected WL to re-program the memory cell A.

If a verifying operation is set to be performed only two times per one-time program voltage applying operation, the verifying process may be performed only up to the verifying operation using the second verifying voltage in FIG. 3. In the case where the verifying operation is set to be performed only two times per one-time program voltage applying operation, the $n^{th}$ verifying voltage may be equal to the second verifying voltage. If the memory cell A is determined to have not reached the set threshold voltage, according to the result of the verifying operation using the second verifying voltage, the increased program voltage $V_{pgm}$ may be applied to re-program the memory cell A.

As described above, if the memory cell A is determined to have reached the set threshold voltage with sequential applications of verifying voltages, programming the memory cell A may end. If the memory cell A is determined to have not reached the set threshold voltage, a process of re-applying a verifying voltage to re-verify the memory cell A may be performed up to n (where n is a number equal to or greater than "2") times.

For example, before a program voltage is increased by ΔVpgm for performing a another programming operation, a plurality of verifying operations may be consecutively performed with sequential applications of first through $n^{th}$ verifying voltages at desired, or alternatively, predetermined intervals. The desired, or alternatively, predetermined intervals between the consecutive verifying operations may be within a range between about 1 μs and 100 μs.

If the verifying operation using the $n^{th}$ verifying voltage determines that the programmed memory cell A has not reached the set threshold voltage, the program voltage $V_{pgm}$ may be increased by ΔVpgm and re-applied to the selected WL to re-program the memory cell A. A verifying operation as described above may be performed after the programming of the memory cell A.

If during any of the n-times verifying operations the programmed memory cell A is determined to have reached the set threshold voltage, in operation S110, programming the memory cell A may end.

As described above, in the programming method according to an example embodiment, a verifying voltage may be consecutively applied to a programmed memory cell to perform a verifying operation a plurality of times.

Figure 6:
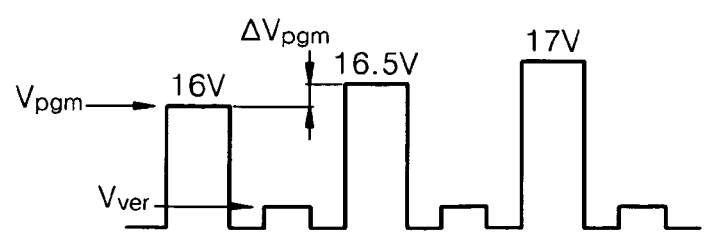
FIG. 6 illustrates example waveforms of voltage pulses applied to a word line (WL) selected if programming is performed using a general ISPP method.

For a comparison to example embodiments, FIG. 6 illustrates example waveforms of voltage pulses applied to a selected WL if programming is performed using a general ISPP method. Referring to FIG. 6, after a program voltage is applied to program a memory cell, a verifying voltage $V_{ver}$ is applied to verify the memory cell. If the memory cell is determined to have not reached a desired, or alternatively, a predetermined threshold voltage, the program voltage is increased by a desired or alternatively, predetermined magnitude and re-applied to re-program and re-verify the memory cell. As described above, in the general ISPP method, a verifying operation is performed one time per one-time program voltage applying operation with a progressive increase in the program voltage until the memory cell is programmed to reach the set threshold voltage.

According to a programming method of an example embodiment, a verifying operation may be performed consecutively at least two or more times per one-time program voltage applying operation with a progressive increase in a program voltage until a memory cell reaches a set threshold voltage.

According to an example embodiment, verifying voltage pulses may be applied sequentially two or three times per one-time program voltage applying operation to perform a verifying operation consecutively two, three, or more times.

In FIGS. 4 and 5, a verifying voltage is applied sequentially three times per one-time program voltage applying operation to perform a verifying operation consecutively three times.

As described above, according to a programming method of an example embodiment, a verifying operation may be performed consecutively two or more times per one-time program voltage applying operation. The magnitude of the verifying voltage applied during a plurality of consecutive performances of the verifying operation may be equal to that of FIG. 4, e.g., constant, or may sequentially decrease as illustrated in FIG. 5.

As illustrated in FIG. 4, if a verifying voltage is sequentially applied at the same magnitude to perform a verifying operation consecutively a plurality of times, by repeated verification of two or more times, a memory cell having a threshold voltage that increases with time after program voltage pulses are applied and will pass verification need not be re-programmed. Therefore, the memory cell may not be over-programmed. Accordingly, the dispersion of a program threshold voltage may be adjusted to be narrower.

As illustrated in FIG. 5, if a verifying operation is performed consecutively a plurality of times, a verifying voltage may progressively decrease by a same magnitude. For example, the verifying voltage may progressively decrease by a desired, or alternatively a predetermined (e.g., a same) magnitude within a range between about 0.05V and 0.35V, for example, within a range between about 0.1V and 0.2V. For example, a difference between the first and $n^{th}$ verifying voltages may be smaller than an increase in a threshold voltage during a one-time programming operation.

If a magnitude of a verifying voltage progressively decreases as described above, a memory cell having a lower threshold voltage than an optimal or set threshold voltage of an optimally programmed memory cell may pass the verifying operation.

For example, if the first verifying voltage of the first through $n^{th}$ verifying voltages (where n is a number equal to or larger than "2"), which are sequentially and consecutively applied and progressively decrease, is set to be equal to the set threshold voltage, the second through $n^{th}$ verifying voltages may be lower than the set threshold voltage.

If the memory cell is determined to have passed verification during the verifying operation using the second through $n^{th}$ verifying voltages, the memory cell may have a threshold voltage lower than the set threshold voltage.

For example, if the set threshold voltage is 3V, and a verifying operation is set to be performed consecutively two times using a verifying voltage which progressively decreases, a programmed memory cell may pass the verifying operation at a threshold voltage greater than a range between about 2.65V and 2.95V.

Accordingly, the threshold voltage of the memory cell may be relatively slightly sacrificed if the verifying voltage progressively decreases. However, if programming is performed using an ISPP method with a progressive increase in a program voltage by about 0.5V, the threshold voltage may more substantially increase by, for example, about 0.2V to 0.3V per one-time programming operation and maximally up to about 0.5V. Therefore, an increase of the dispersion of the threshold voltage caused by over-programming may further be improved.

Accordingly, if the first through $n^{th}$ verifying voltages are sequentially applied to perform a verifying operation consecutively a plurality of times, the dispersion of a program threshold voltage may be adjusted to be narrower, and a memory cell may not be over-programmed.

If the verifying voltage is sequentially applied at the same magnitude to perform a verifying operation consecutively a plurality of times as illustrated in FIG. 4, the magnitude of the verifying voltage may be slightly lower than that of a desired, or alternatively, a predetermined threshold voltage, e.g., an optimal threshold voltage. In the case where the verifying voltage is sequentially applied at the same magnitude, a difference between the set threshold voltage and the desired, or alternatively, the predetermined threshold voltage may be smaller than an increase in a threshold voltage during a one-time programming operation.

For example, the set threshold voltage may be lowered by about 0.05V to 0.35V if compared to the desired, or alternatively, the predetermined threshold voltage, or, for example, lowered by about 0.1V to 0.2V. If the desired or alternatively, the predetermined threshold voltage is about 3V, the set threshold voltage may be any value within a range between about 2.65V and 2.95V.

Even if the set threshold voltage is within a range between about 2.65V and 2.95V, the threshold voltage of the memory cell may be slightly sacrificed. However, the memory cell may not be over-programmed by performing a programming operation once more, and the dispersion of a program threshold voltage may be adjusted to be further narrower.

A program scheme and dispersion of a threshold voltage of a memory cell using the programming method according to an example embodiment will now be compared with a program scheme and dispersion of a threshold voltage of a memory cell using a conventional programming method using a general ISPP method.

Figure 7:
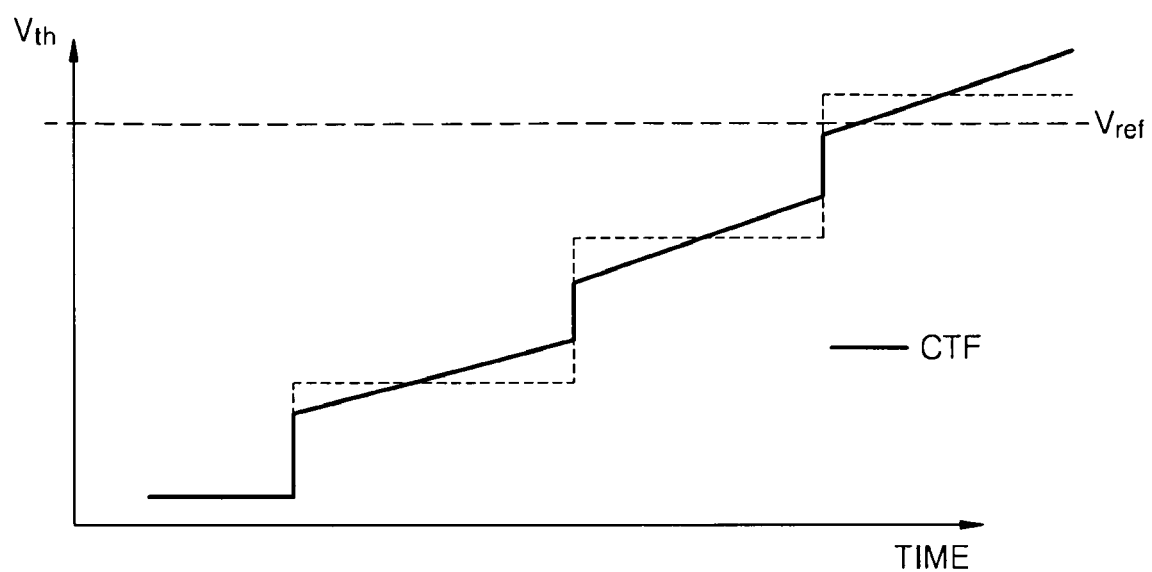
FIG. 7 is an example graph illustrating variations in a threshold voltage during programming of a CTF memory cell with respect to the example waveforms of FIG. 6.
Figure 8A:
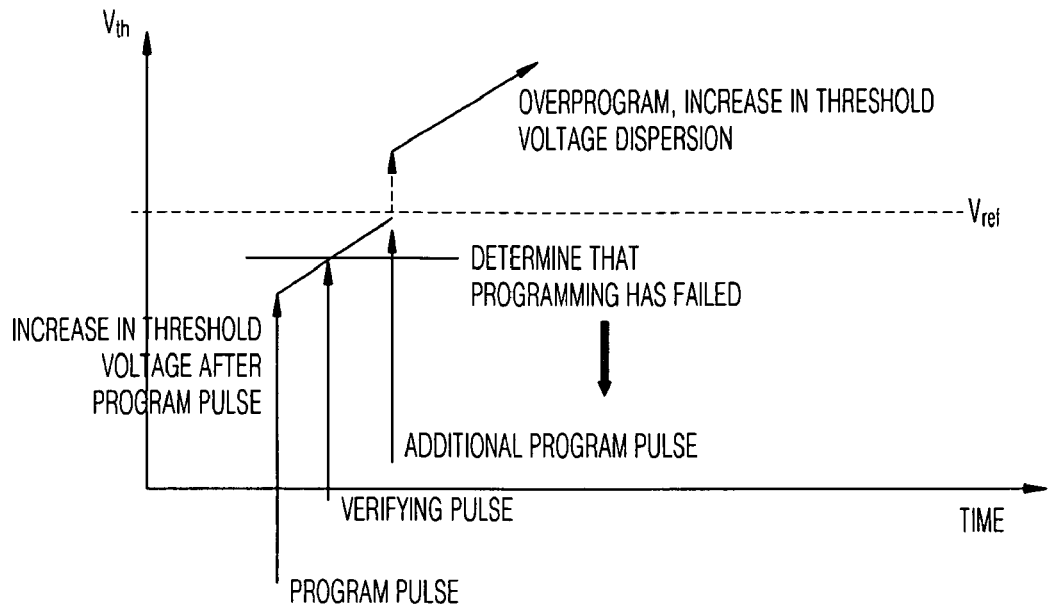
FIGS. 8A and 8B are example graphs illustrating a program scheme and threshold voltage dispersion of a memory cell during programming using a conventional programming method.
Figure 8B:
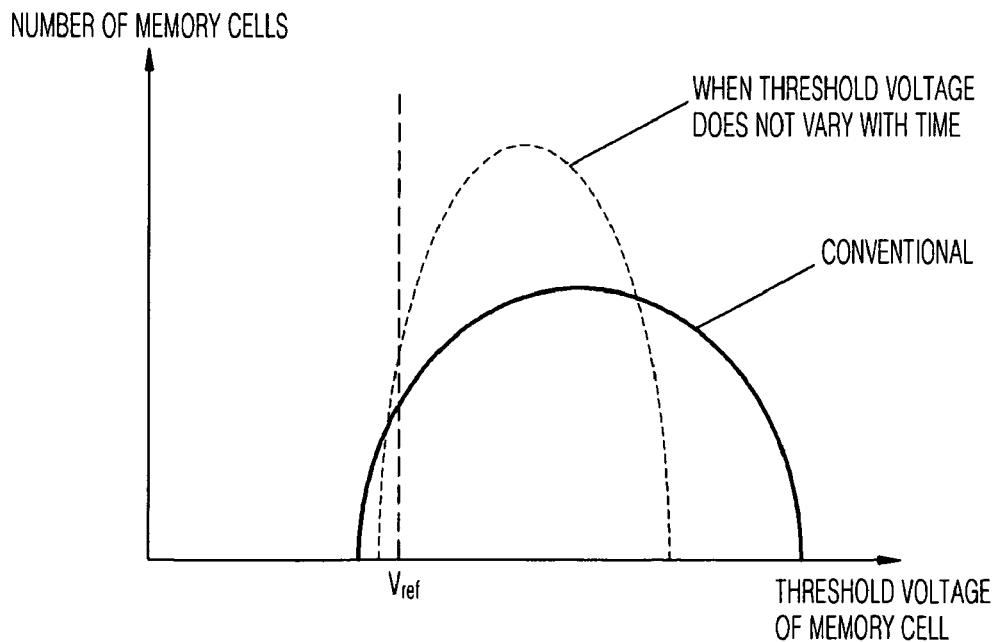
Figure 9A:
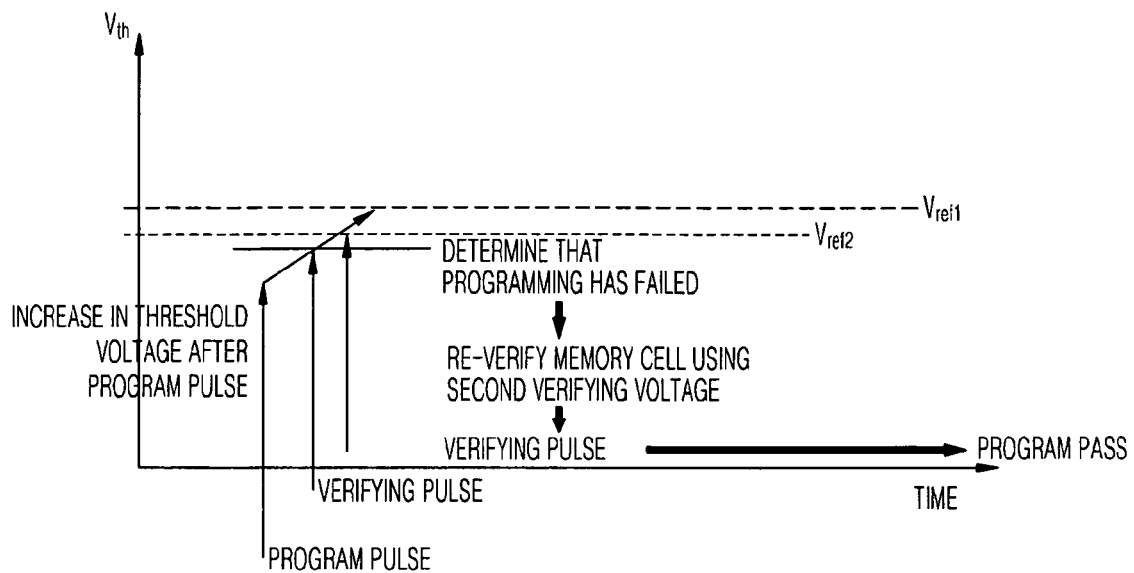
FIGS. 9A and 9B are example graphs illustrating a program scheme and threshold voltage dispersion of a memory cell during programming using a programming method of an example embodiment.
Figure 9B:
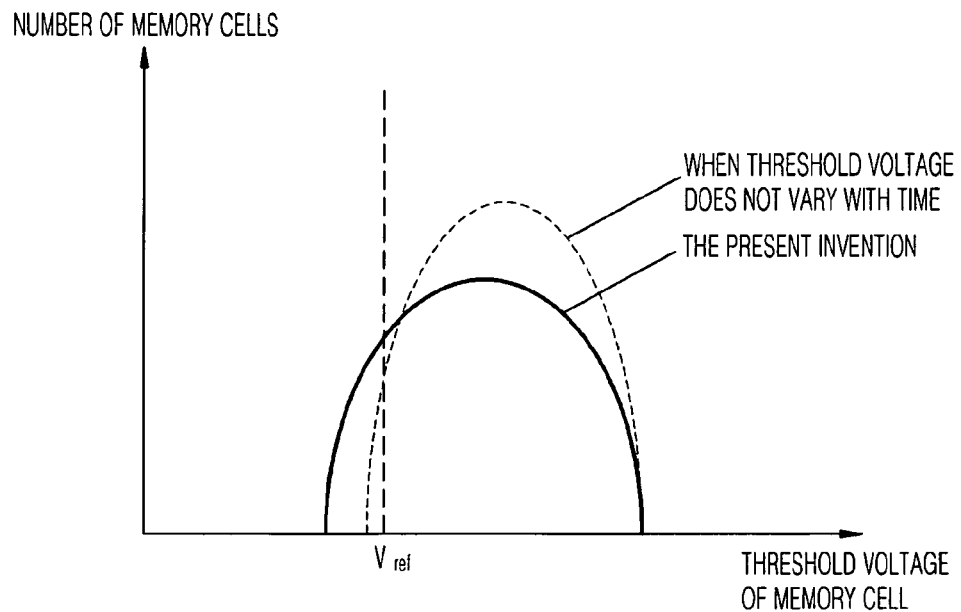

FIG. 7 is an example graph illustrating variations in a threshold voltage during programming of a charge trap flash (CTF) memory cell with respect to the example waveforms of the voltage pulses of FIG. 6. FIGS. 8A and 8B are example graphs respectively illustrating a program scheme and dispersion of a threshold voltage of a memory cell using a conventional programming method. FIGS. 9A and 9B are example graphs respectively illustrating a program scheme and dispersion of a threshold voltage of a memory cell using the programming method of an example embodiment.

Referring to FIGS. 6 and 7, if programming is performed using the general ISPP method, a one-time program voltage applying operation and a one-time verifying operation are alternately repeated with a progressive increase in a program voltage from 1.6V by 0.5V increments.

During programming as described above, a CTF memory cell may have feature of a transient threshold voltage which increases with time after program pulses are applied. For example, if programming is performed using program pulses of 17V, a threshold voltage may be determined to be lower than a verifying voltage $V_{ref}$. However, the threshold voltage may increase with time and exceed the verifying voltage $V_{ref}$.

Accordingly, a verifying operation may determine that programming has failed as shown in FIG. 8A. Therefore, the program pulses are re-applied. As a result, a memory cell may be over programmed. Therefore, as shown in FIG. 8B, the dispersion of the threshold voltage of the memory cell increases in comparison with the case in which a threshold voltage does not vary with time.

If programming is performed using the general ISPP method, a sufficiently programmed memory cell may be determined as program fail during verifying due to the transient threshold voltage. Therefore, a possibility the sufficiently programmed memory cell being additionally programmed exists. As a result, the possibility of the threshold voltage being more dispersed increases.

If a programming method of an example embodiment is used, a memory cell may be determined as program fail during a verifying operation using pulses of a first verifying voltage $V_{ref1}$ as shown in FIG. 9A. However, if the verifying operation is repeated using pulses of a second verifying voltage $V_{ref2}$ lower than the pulses of the first verifying voltage $V_{ref1}$ after a desired, or alternatively, a predetermined time elapses, the memory cell may be determined as program pass. Accordingly, another programming operation need not be performed. Therefore, dispersion of a threshold voltage of a memory cell may be greatly reduced. For example, the dispersion of the threshold voltage of the memory cell may be more similar to that of a threshold voltage which does not vary with time as illustrated in FIG. 9B.

In FIG. 9A, the verifying operation is repeated using the second verifying voltage $V_{ref2}$ lower than the first verifying voltage $V_{ref1}$. However, the verifying operation may be repeated using a second verifying voltage $V_{ref2}$ equal to the first verifying voltage $V_{ref1}$. Even in a case where the second verifying voltage $V_{ref2}$ is equal to the first verifying voltage $V_{ref1}$, the dispersion of the threshold voltage of the memory cell may be more greatly reduced. For example, the dispersion of the threshold voltage of the memory cell may be more similar to that of a threshold voltage which does not vary with time.

There has been described a process of applying verifying voltage pulses consecutively at least two times or more after a one-time programming to perform verifying as long as a threshold voltage does not reach a set threshold voltage. The process may be selectively used only if a memory cell has a threshold voltage equal to or greater than a desired, or alternatively, a predetermined value if a program voltage applying operation and a verifying operation are repeated with a progressive increase in a program voltage as illustrated in FIG. 10.

For example, a programmed threshold voltage of a memory cell may not reach a set threshold voltage during initial programming using an ISPP method. If the programmed threshold voltage of the memory cell has not reached the set threshold voltage, a program voltage increased by one step may be applied instead of at least two or more consecutive performances of a verifying operation to re-perform a programming operation. In this case, over programming does not occur. Only if the memory cell has a threshold voltage equal to or greater than a desired, or alternatively, a predetermined value, the verifying operation may be performed consecutively at least two or more times. Therefore, an entire programming time may be effectively reduced.

Figure 10:
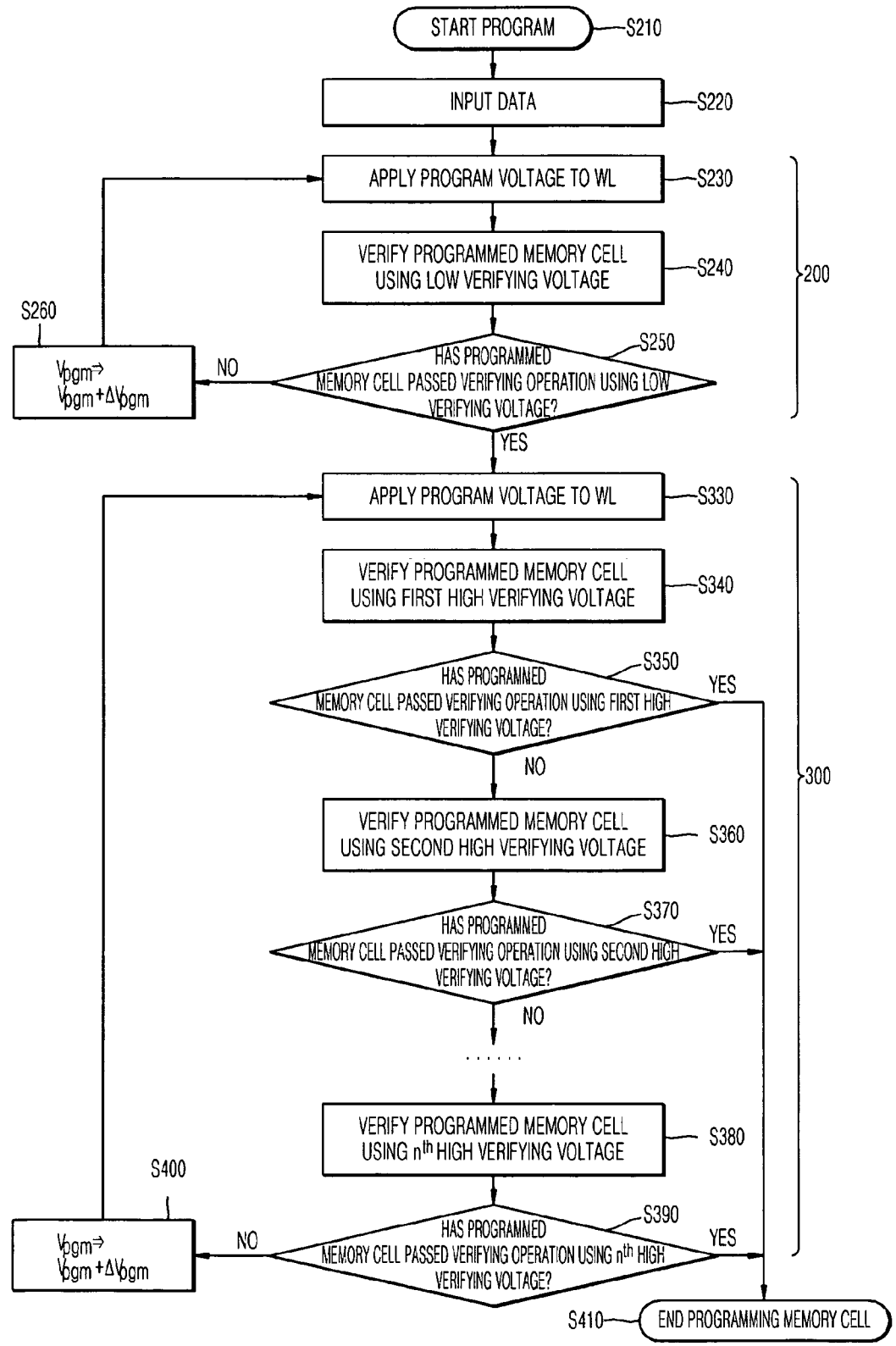
FIG. 10 is a flowchart of programming operations of a programming method according to another example embodiment.
Figure 11:
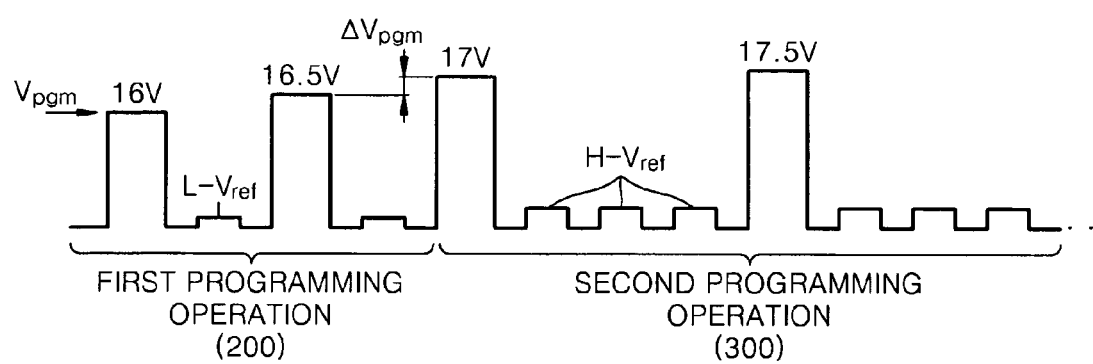
FIGS. 11 and 12 illustrate example waveforms of voltage pulses applied to a WL selected if programming is performed using the programming method of FIG. 10, according to example embodiments.
Figure 12:
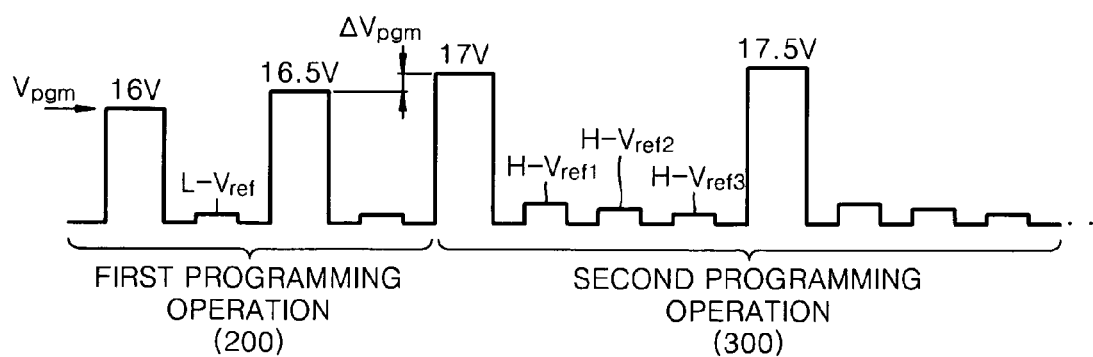

FIG. 10 is a flowchart of programming operations of a programming method according to another example embodiment. FIGS. 11 and 12 illustrate example waveforms of voltage pulses applied to a selected WL during programming using the programming method of FIG. 10, according to example embodiments. Comparing FIGS. 10 through 12 with FIGS. 3 through 5, the programming method of FIG. 10 is different from that of FIG. 3 in that a one-time verifying operation may be performed per one-time program voltage applying voltage until a memory cell reaches a threshold voltage equal to or greater than a desired, or alternatively, a predetermined value. However, the programming method of FIG. 10 during programming after the memory cell has the threshold voltage equal to or greater than the desired, or alternatively, the predetermined value may be substantially the same as that of FIG. 3.

Referring to FIG. 10, a programming method according to another example embodiment may include operations of applying a program voltage to program a memory cell and verifying the programmed memory cell. The verifying operation may be performed consecutively a plurality of times after application of the program voltage.

A programming method of another example embodiment may include first and second programming operations 200 and 300. The first programming operation 200 may include a verifying operation using a relatively lower verifying voltage and the second programming operation 300 may include a verifying operation using a higher verifying voltage than the lower verifying voltage and may be performed after the first programming operation 200.

The first programming operation 200 may be performed until the verifying operation is passed using the lower verifying voltage. The second programming operation 300 may be performed on a memory cell which has passed the verifying operation using the lower verifying voltage.

In the first programming operation 200, a pair of a one-time program voltage applying operation and a one-time verifying operation may be repeatedly performed.

The verifying operation may be performed consecutively a plurality of times in the second programming operation 300. The second programming operation 300 may correspond to the programming method of an example embodiment illustrated with reference to FIG. 3. A verifying voltage higher than the lower verifying voltage may be used in the second programming operation 300.

A programming method of another example embodiment may be performed using an ISP method of performing programming with a progressive increase in a program voltage as illustrated in FIGS. 11 and 12.

For example, in the first programming operation 200, a pair of a one-time program voltage applying operation and a one-time verifying operation may be repeatedly performed with a progressive increase in a program voltage until a memory cell to be programmed passes the verifying operation using the lower verifying voltage.

The second programming operation 300 may be performed on the memory cell which has passed the verifying operation using the lower verifying voltage. For example, a pair of a one-time program voltage applying operation and a plurality of consecutive verifying operations using a higher verifying voltage may be repeatedly performed with a progressive increase in a program voltage.

A difference between the lower and higher verifying voltages may be approximately equal to or greater than an increase in a threshold voltage caused by at least a one-time program voltage applying operation. The lower verifying voltage may be lower than the higher verifying voltage within a range between about 0.2V and 1.0V.

For example, the higher verifying voltage used in the second programming operation 300 may be about 3V. In a case where the higher verifying voltage is about 3V, the lower verifying voltage may be any value within a range between about 2.0V and 2.8V lower than the higher verifying voltage within a range between about 0.2V and 1.0V. If a magnitude of the higher verifying voltage applied during the performances of the plurality of consecutive verifying operations progressively decreases, the higher verifying voltage used in the second programming operation 300 may progressively decrease from 3V.

FIG. 11 illustrates example waveforms of a voltage used in a programming method of another example embodiment. In the first programming operation 200, a pair of a one-time program voltage applying operation and a one-time verifying operation using a lower verifying voltage is repeatedly performed with a progressive increase in a program voltage. In the second programming operation 300, a pair of a one-time program voltage applying operation and a plurality of consecutive verifying operations using a higher verifying voltage having a same magnitude is repeatedly performed with a progressive increase in a program voltage.

FIG. 12 illustrates example waveforms a voltage used in the programming method of FIG. 10, according to another embodiment. In the first programming operation 200, a pair of a one-time program voltage applying operation and a one-time verifying operation using a lower verifying voltage is repeatedly performed with a progressive increase in a program voltage. In the second programming operation 300, a pair of a program voltage applying operation and a plurality of consecutive verifying operations using a higher verifying voltage, which progressively decreases, is repeatedly performed with a progressive increase in a program voltage.

In FIGS. 11 and 12, a basic program voltage is 16V and program voltage progressively increases by 0.5V increments to perform a programming operation. In the first programming operation 200, a pair of a one-time program voltage applying operation and a one-time verifying operation is repeated two times. In the second programming operation 300, a verifying operation is performed consecutively three times per one-time program voltage applying operation. In FIG. 11, L-Vref denotes a lower verifying voltage, and H-Vref denotes a higher verifying voltage having the same magnitude. In FIG. 12, L-Vref denotes a lower verifying voltage, and H-Vref1, H-Vref2, and H-Vref3 denote higher verifying voltages which progressively decrease. The lowest higher verifying voltage of the higher verifying voltages, e.g., H-Vref3, may be higher than the lower verifying voltage L-Vref.

A process of performing programming using a programming method of another example embodiment will now be described in more detail with reference to FIG. 10.

In operation S210, a program mode may start. In operation S220, data may be input to select a specific WL, e.g., the WL WL29. The first programming operation 200 may be performed.

The first programming operation 200 may include operation S230 in which a program voltage $V_{pgm}$ may be applied to the selected WL to program the selected WL. The memory cell A corresponding to a bit line supplied with a ground voltage and being connected to the selected WL, may be programmed.

A one-time program voltage applying operation may be performed on the memory cell A. In operation S240, a lower verifying voltage may be applied to the selected WL to verify the programmed memory cell A. In operation S250, a determination is made as to whether the programmed memory cell A has passed the verifying operation using the lower verifying voltage.

If, in operation S250, the programmed memory cell A is determined to not have a threshold voltage equal to or greater than a desired, or alternatively, a predetermined value, and therefore, that the programmed memory cell A has not passed the verifying operation using the lower verifying voltage, in operation S260, the program voltage $V_{pgm}$ may be increased by ΔVpgm. In operation S230, the increased program voltage may be applied to the selected WL to re-program the memory cell A. In operation S240, the lower verifying voltage may be applied to verify the memory cell A. In operation S250, a determination is made as to whether the memory cell A has passed the verifying operation using the lower verifying voltage.

A process of programming the memory cell A with a progressive increase in a program voltage and verifying the memory cell A using a lower verifying voltage is repeatedly performed until the memory cell A has a threshold voltage equal to or greater than a desired, or alternatively, a predetermined value, and therefore, passes a verifying operation using the lower verifying voltage.

In the first programming operation 200, a verifying operation is performed on the memory cell A using a lower verifying voltage once per one-time program voltage applying operation.

If, in operation S250, the programmed memory cell A is determined to have passed the verifying operation using the lower verifying voltage, the second programming operation 300 may be performed. A process corresponding to a programming method of tan example embodiment described with reference to FIG. 3 may be performed in the second programming operation S300.

For example, in operation S330, the program voltage $V_{pgm}$ may be applied to the selected WL, e.g., the WL WL29, to re-program the memory cell A which has passed the verifying operation using the lower verifying voltage. If an ISPP method is used, a program voltage first applied in the second programming operation 300 may be a voltage increased by ΔVpgm compared to a program voltage lastly applied in the first programming operation 200.

After programming the memory cell A, a higher verifying voltage may be applied to the selected WL to verify the programmed memory cell A as follows.

In operation S340, a first higher verifying voltage may be applied to the programmed memory cell A to verify the programmed memory cell A. In operation S350, a determination may be made as to whether the programmed memory cell A has reached a set threshold voltage and has been programmed well.

If, in operation S350, the memory cell A is determined to have reached the set threshold voltage, and therefore, that the memory cell A is programmed to a desired, or alternatively, a predetermined level, in operation S410, programming the memory cell A may end. If, in operation S350, the programmed memory cell A is determined to have not reached the set threshold voltage, in operation S360, a second higher verifying voltage may be applied to re-verify the programmed memory cell A. In operation S370, a determination may be made as to whether the programmed memory cell A has reached the set threshold voltage.

If, in operation S370, that the memory cell A is determined to have reached the set threshold voltage, according to a result of the verifying operation using the second higher verifying voltage, in operation S410, programming the memory cell A may end.

If, in operation S370, the memory cell A is determined to have not reached the set threshold voltage, according to the result of the verifying operation using the second higher verifying voltage, the programmed memory cell A may be re-verified.

If in any verifying operation the memory cell A is determined to have not reached the set threshold voltage, verifying the memory cell A may be performed up to a verifying operation using an $n^{th}$ higher verifying voltage. In operation S380, the $n^{th}$ higher verifying voltage may be applied to re-verify the programmed memory cell A. In operation S390, a determination may be made as to whether the programmed memory cell A has reached the set threshold voltage.

If, in operation S390, the programmed memory cell A is determined to have not reached the set threshold voltage, according to the result of the verifying operation using the $n^{th}$ higher verifying voltage, in operation S400, the program voltage $V_{pgm}$ may be increased by $\Delta V pgm$. In operation S330, the program voltage increased by $\Delta V pgm$ may be applied to the selected WL to re-program the memory cell A.

If a verifying operation using a higher verifying voltage is set to be performed only at least two times per one-time program voltage applying operation, the programming method of FIG. 10 may be performed only up to the verifying operation using the second higher verifying voltage. In a case where the verifying operation is performed only two times, the $n^{th}$ higher verifying voltage may be equal to the second higher verifying voltage. If the memory cell A is determined to have not reached the set threshold voltage, according to the result of the verifying operation using the second verifying voltage, the program voltage increased by $\Delta V pgm$ may be applied to re-program the memory cell A.

As described above, if the memory cell A is determined to have reached the set threshold voltage, according to the results of verifying operations performed with sequential applications of higher verifying voltages, programming the memory cell A may end. If the memory cell A is determined to have not reached the set threshold voltage, a process of re-applying the higher verifying voltage to verify the memory cell A may be performed up to n (where n is a number equal to or greater than "2") times.

For example, before a program voltage is increased by $\Delta V pgm$ to perform a another programming operation, a verifying operation may be performed consecutively a plurality of times with sequential applications of first through $n^{th}$ verifying voltages at desired, or alternatively, predetermined intervals. The desired, or alternatively, predetermined intervals may be within a range between about 1 µs and 100 µs.

If the programmed memory cell A has not reached the set threshold voltage, according to the result of the verifying operation using the $n^{th}$ verifying voltage, the program voltage Vpgm may be increased by $\Delta V pgm$ and applied to the selected WL to repeat the second programming operation 300 as described above.

If any time during the n-times verifying operations the memory cell A is determined to have reached the set threshold voltage, in operation S410, programming the memory cell A may end.

In a programming method of another example embodiment, the first through $n^{th}$ higher verifying voltages may have a same magnitude as illustrated in FIG. 11 or may have magnitudes which progressively decrease as illustrated in FIG. 12.

The second programming operation 300 of a programming method of an example embodiment may substantially corresponds to the programming method of an example embodiment previously described with reference to FIGS. 3 through 5, 7, 9A, and 9B. Therefore, a programming technique using the second programming operation 300 and a program scheme and dispersion of a threshold voltage of a memory cell using the second programming operation 300 will not be repeatedly described herein.

A programming method according to example embodiments has been described as using an ISPP method to progressively increase a program voltage from 16V by 0.5V increments to repeatedly perform program voltage applying and verifying operations. However, example embodiments are not limited thereto. For example, a starting program voltage may have another value which is not 16V, and/or a progressive increase of the program voltage may be another value, e.g., 0.3V, which is not 0.5V.

The programming method according to example embodiments in which a plurality of verifying operations are performed after one-time program voltage applying operation may be applied to perform a program of a multi-level cell (MLC). That is, the first programming operation in which one-time verifying operation using a lower verifying voltage per one-time program voltage applying operation is performed, the second programming operation in which a plurality of verifying operations using a higher verifying voltage per one-time program voltage applying operation are performed, which have been explained with reference to FIGS. 10 through 12, or the programming operation in which a plurality of verifying operations per one-time program voltage applying operation are performed, which has been explained with reference to FIGS. 3 through 5, may be applied to an MLC.

A case where an MLC programming method according to an example embodiment in which a plurality of verifying operations are performed after one-time program voltage applying operation is applied to a 4-level cell will be exemplarily explained. An MLC to which the programming method according to an example embodiment is applied may be any one of a floating gate type memory cell and a charge trap type memory cell, and a memory cell of a NAND or NOR type flash memory.

The 4-level cell in a memory may have a "00" state, "01" state, or "10" state as a program state, and may have a "11" state as an erase state. The "11" state may be considered as a first program state. In this case, the "01", "00", and "10" states may be expressed as second, third, and fourth program states, respectively, in the order of threshold voltage magnitude. Alternatively, the "11" state may be expressed as an erase state, and the "01", "00", and "10" states may be expressed first, second, and third program states, respectively, in the order of threshold voltage magnitude. Here, the order of the "01", "00", and "10" states may be varied in terms of threshold voltage magnitude. For convenience, the "11" state will be expressed as an erase state, and the "01", "00", and "10" states will be expressed as program states herein below.

Figure 13A:
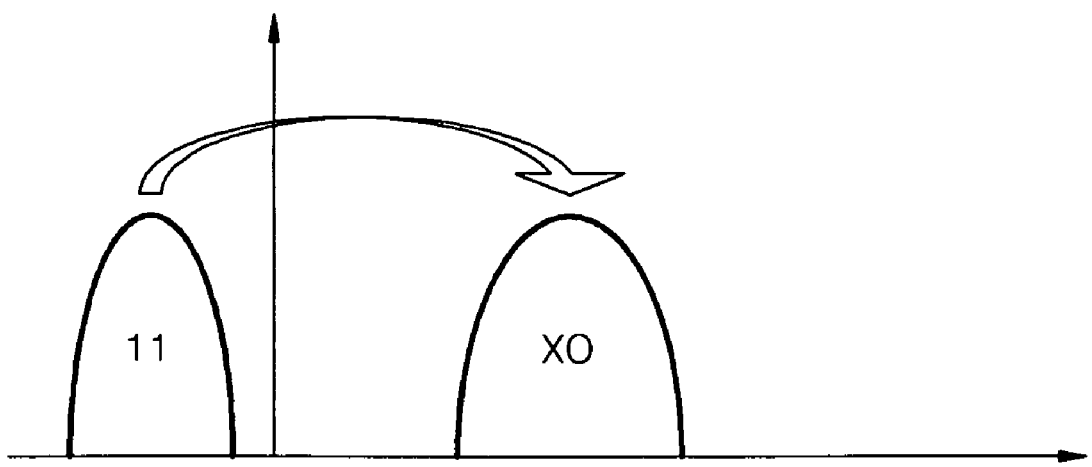
FIGS. 13A and 13B are schematic views for explaining a multi-level cell (MLC) programming method according to an example embodiment.
Figure 13B:
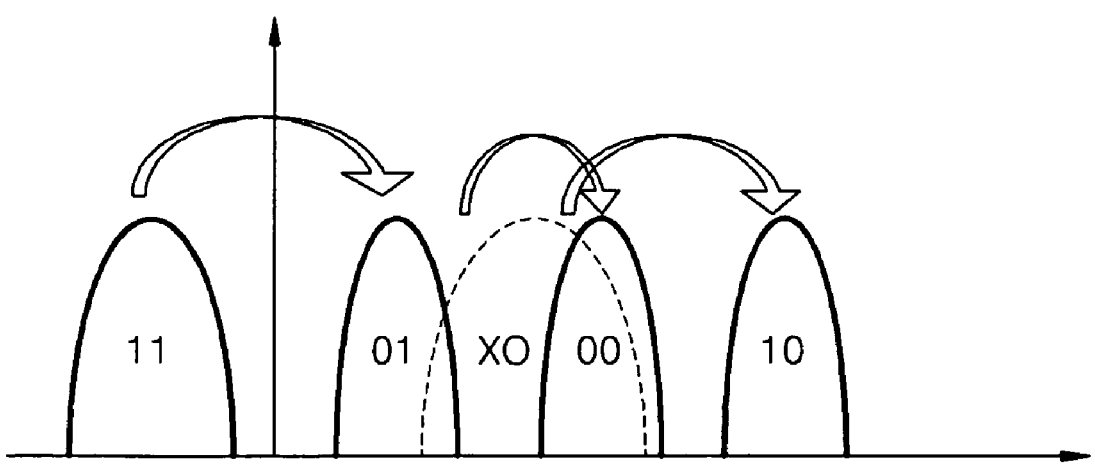
Figure 14A:
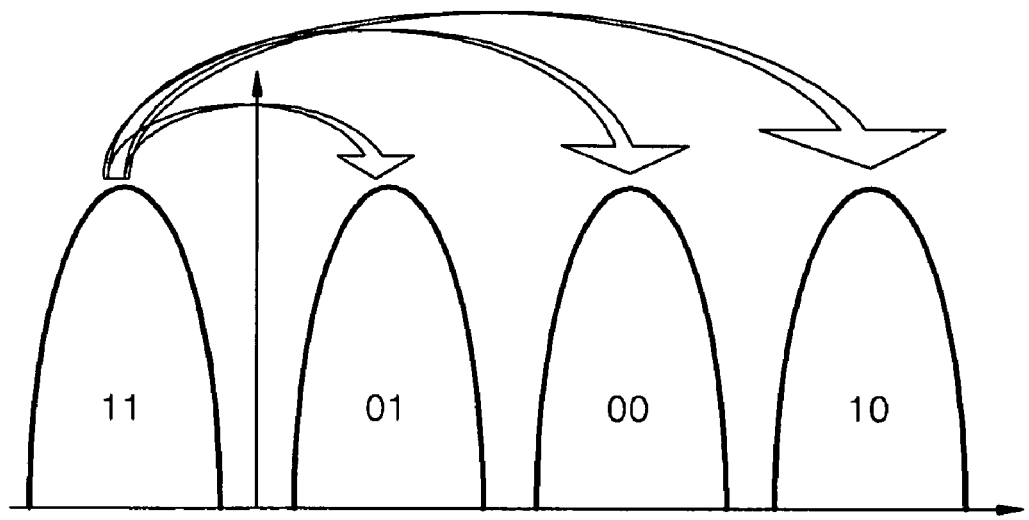
FIGS. 14A and 14B are schematic views for explaining an MLC programming method according to another example embodiment.
Figure 14B:
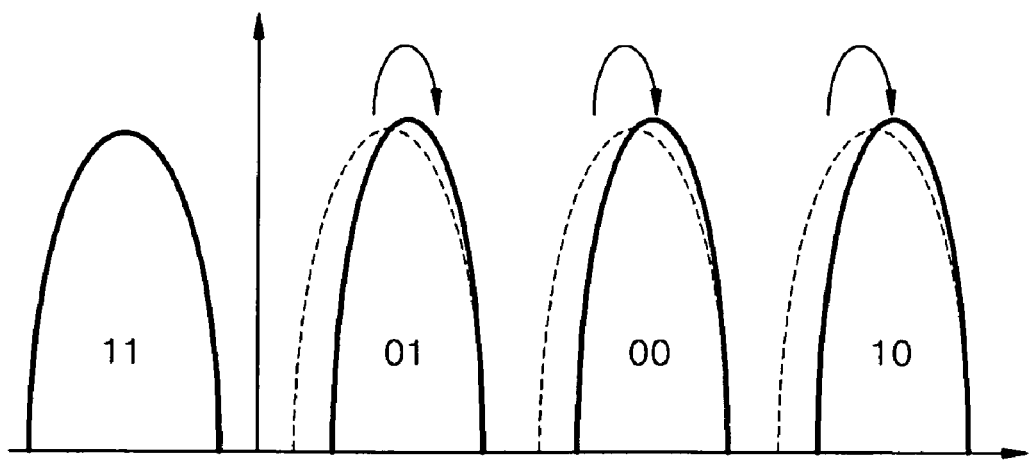

An MLC programming method according to example embodiments of the present invention may be performed by performing the first programming operation on a memory cell in an erase state such that the memory cell in the erase state is programmed to an intermediate program state and by performing the second programming operation on the memory cell in the intermediate program state such that the memory cell in the intermediate program state is programmed to a final program state. The memory cell after the final program state may include three or more levels. FIGS. 13A and 13B are schematic views for explaining an MLC programming method according to an example embodiment. And FIGS. 14A and 14B are schematic views for explaining an MLC programming method according to another example embodiment.

Referring to FIGS. 13A and 13B, a first programming operation is applied to a memory cell in an erase state such that the memory cell in the erase state is programmed to a memory cell in an intermediate state that is a dummy state. Next, a second programming operation is applied to the memory cell in the erase state or the memory cell in the dummy state such that the memory cell in the erase state or the memory cell in the dummy state is programmed to a memory cell in a predetermined program state that is a final program state.

In the first programming operation, which is based on the first programming operation described with reference to FIGS. 10 through 12, a pair of operations including one-time program voltage applying operation and one-time verifying operation using a lower verifying voltage is repeatedly performed with a progressive increase in a magnitude of a program voltage until a verification using the lower verifying voltage is passed. In the second programming operation, which is based on the programming operation described with reference to FIGS. 3 through 5 or the second programming operation described with reference to FIGS. 10 through 12, a pair of operations including one-time program voltage applying operation and a plurality of consecutive verifying operations using a higher verifying voltage is repeatedly performed with a progressive increase in a magnitude of a program voltage until a verification using the higher verifying voltage is passed. Magnitudes of the higher verifying voltage used when the plurality of consecutive verifying operations are performed may be the same or may be progressively decreased as described above. The higher verifying voltage may be greater by a predetermined magnitude than a lower verifying voltage as described above.

The program state obtained by applying the second programming operation to the memory cell in the dummy state may have a higher minimum threshold voltage than that of the program state obtained by applying the second programming operation to the memory cell in the erase state.

If the memory cell is a 4-level cell, the erase state may be a "11" state and the program state may be at least one of "01", "00, and "10" states.

If the first programming operation is applied to the memory cell in the "11" state that is the erase state, for example, a least significant bit (LSB) may be programmed, and thus a "X0" state that is a dummy state may be obtained. Here, a dummy state refers to a state that is not used as a program state yet and is an intermediate state for obtaining a program state by using the second programming operation.

The "X0" state may correspond to the "00" state that is the second program state in the memory cell (4-level cell). That is, as will be described, the "00" state may be obtained by moving a minimum threshold voltage of the "X0" state and reducing a threshold voltage distribution range. Since the "X0" state is obtained by performing one-time verifying operation per one-time program voltage applying operation, the "X0" state has a wider threshold voltage distribution than that of a program state desired to be formed. Since the "X0" state is not used as a final program state, such a wide threshold voltage distribution does not cause any problem.

Since the wide threshold voltage distribution of the "X0" state does not cause any problem, a program voltage increment Δ V'pgm when the memory cell in the "11" state is programmed to the "X0" state may be a relatively large value in order to reduce a programming time.

In order to program the "11" state to the "01" state, the "00" state, and the "10" state, the memory cell in the "11" state is first programmed to obtain the "X0" as described above, and then, for example, a most significant bit (MSB) of the memory cell in the "11" state and the memory cell in the "X0" state that is the dummy state is programmed as illustrated in FIG. 13B.

Accordingly, the memory cell can be programmed from the "11" state to the "01" state, and from the "X0" state to the "00" state and the "10" state.

The memory cell may be programmed from the "11" to the "01" state and from the "X0" state to the "00" state and the "10" state by using the second programming operation in which a plurality of verifying operations per one-time program voltage applying operation are performed.

The "00" state obtained by applying the second programming operation in which a plurality of verifying operations per one-time program voltage applying operation are performed may have a narrower threshold voltage distribution than the "X0" state that is the dummy state since an over program is prevented due to the plurality of verifying operations. Also, since a higher verifying voltage is used, a minimum threshold voltage of the "00" state may be higher than that of the "X0" state that is the dummy state using a lower verifying voltage, and a threshold voltage distribution range of the "00" state may be compressed to be narrower than that of the "X0" state that is the dummy state.

According to the MLC programming method according to an example embodiment, for the operation of programming the memory cell from the "11" state that is the erase state to the "X0" state that is the dummy state and programming the "X0" state to the "00" state, the programming operation explained with reference to FIGS. 10 through 12 may be used.

Also, for the operation of programming the "11" that is the erase state to the "X0" state that is the dummy state, the first programming operation explained with reference to FIGS. 10 through 12 may be used. Also, for the operation of programming the memory cell from the "11" state that is the erase state and the "X0" state that is the dummy state to the "01" state and the "10" state, the programming operation explained with reference to FIGS. 3 through 5 or the second programming operation explained with reference to FIGS. 10 through 12 may be used.

A threshold voltage distribution range of each of the "01" state obtained from the "11" state and the "10" state obtained from the "X0" state by applying the programming operation in which a plurality of verifying operations per one-time program voltage applying operation are performed may be compressed to be narrower than that of the "11," state or the "X0" state by being prevented an over program.

In order to further reduce a threshold voltage distribution range, a program voltage increment Δ Vpgm when the memory cell is programmed from the "11" state to the "01" state and from the "X0" state to the "00" state and the "10" state by using the second programming operation may be lower than a program voltage increment Δ V'pgm when the memory cell is programmed from the "11" state to the "X0" state that is the dummy state by using the first programming operation.

As described above, since the first programming operation uses a program voltage pulse and a single verifying pulse as a lower verifying voltage, the "X0" state has a relatively wide threshold voltage distribution.

However, since the second programming operation uses a program voltage pulse and a plurality of verifying pulses as a high verifying voltage, an over program is prevented and the "00" state has a narrower threshold voltage distribution than that of the "X0" state. When the higher verifying voltage is greater than the lower verifying voltage, a minimum threshold voltage of the "00" state is moved to be higher than a minimum threshold voltage of the "X0" state, and a threshold voltage distribution range of the "00" state is narrower than a threshold voltage range of the "X0" state.

Also, a threshold voltage distribution range of each of the "01" state obtained from the "11" state by using the second programming operation and the "10" state obtained from the "X0" state by using the second programming operation is narrower than that of the "11" state or the "X0" state since an over program is prevented.

Accordingly, the programming method according to an example embodiment in which a plurality of verifying operations are performed after one-time program voltage applying operation can narrow a threshold voltage distribution range of each program state in MLC program and can prevent an over program.

Referring to FIGS. 14A and 14B, a first programming operation is applied to a memory cell in an erase state such that the memory cell in the erase state is programmed to a memory cell in a desired program state. Next, a second programming operation is applied to the memory cell in the desired program state such that the memory cell in the desired program state is programmed to a memory cell in a final program state to increase a minimum threshold voltage of the desired program state and reduce a threshold voltage distribution range. The desired program state obtained by performing the first programming operation may be an intermediate program state, and the final program state may be obtained by performing the second programming operation to increase the minimum threshold voltage and reduce the threshold voltage distribution range.

In the first programming operation, which is based on the first programming operation described with reference to FIGS. 10 through 12, a pair of operations including one-time program voltage applying operation and one-time verifying operation using a lower verifying voltage is repeatedly performed with a progressive increase in a magnitude of a program voltage until the verification using the lower verifying voltage is passed. In the second programming operation, which is based on the programming operation described with reference to FIGS. 3 through 5 and the second programming operation described with reference to FIGS. 10 through 12, a pair of operations including one-time program voltage applying operation and a plurality of consecutive verifying operations using a higher verifying voltage is repeatedly performed with a progressive increase in a magnitude of a program voltage until the verification using the higher verifying voltage is passed. Magnitudes of the higher verifying voltage used when the plurality of consecutive verifying operations are performed may be the same or may be progressively decreased as described above. The higher verifying voltage may be greater by a predetermined magnitude than a lower verifying voltage as described above.

Referring to FIG. 14A, when the memory cell is a 4-level cell, the first programming operation is applied to the memory cell in a "11" state such that the memory cell in the "11" state is first programmed to a "01" state, a "00" state, or a "10" state. Next, referring to FIG. 14B, the second programming operation is applied to the memory cell first programmed to the "01" state, the "00" state, or the "10" state, such that a minimum threshold voltage of the "01" state, the "00" state, or the "10" state is increased and a threshold voltage distribution range of the "01" state, the "00" state, or the "10" state is reduced.

Accordingly, since the MLC programming method including the first and second programming operations performs one-time verifying operation per one-time program voltage applying operation when a threshold voltage of the memory cell is far from a set threshold voltage and performs a plurality of verifying operations per one-time program voltage applying operation when the threshold voltage of the memory cell is close to the set threshold voltage, an overall programming time can be reduced, an over program can be prevented, and a threshold voltage distribution range in each program state can be reduced.

In the MLC programming method according another example embodiment, a memory cell in an erase state may be first programmed to a predetermined program state (intermediate program state) by performing one-time verifying operation per one-time program voltage applying operation with a progressive increase in a program voltage until the verifying operation using a verifying voltage lower than a lower verifying voltage used in the first programming operation is passed, and then the memory cell in the predetermined program state may be programmed to a final program state by sequentially performing the first programming operation and the second programming operation to increase a minimum threshold voltage of the predetermined program state and reduce a threshold voltage distribution range.

A NAND flash memory is divided into blocks in each of which memory cells can be simultaneously erased, and each of the blocks includes a plurality of memory cell arrays. For example, a NAND flash memory may be divided into 1024 blocks, and each of the 1024 blocks may include 8512 memory cell arrays. The memory cell arrays are divided into even arrays and odd arrays, and the even arrays and the odd arrays are connected to bit lines. During reading and programming, memory cells connected to the same word line and the same type of bit line (for example, even bit lines or odd bit lines) may be simultaneously selected to be read or programmed. Simultaneously read or programmed data forms a logical page. For example, if one block includes n word lines, one block may store at least 2 n logical pages because each of the n word lines may include odd and even pages.

A memory cell in a block may have 1 to 4 adjacent memory cells. Among the 4 adjacent memory cells, two may be arranged in the same NAND string and the remaining two may be arranged in an adjacent NAND string. In order to reduce a gate coupling effect between adjacent memory cells, a first page of a specific memory cell is programmed, a first page of memory cells adjacent to the specific memory cell is programmed, and then a second page of the specific memory cell is programmed. Memory cells for storing 2 bit data store the data in 2 logical pages.

When such a NAND flash memory is programmed to a single-level cell by using the programming method of FIGS. 10 through 12, or is programmed to an MLC by using the MLC programming method of FIGS. 13A through 14B, memory cells in the same NAND string may be programmed as follows in order to reduce a gate coupling effect between adjacent memory cells.

Figure 15:
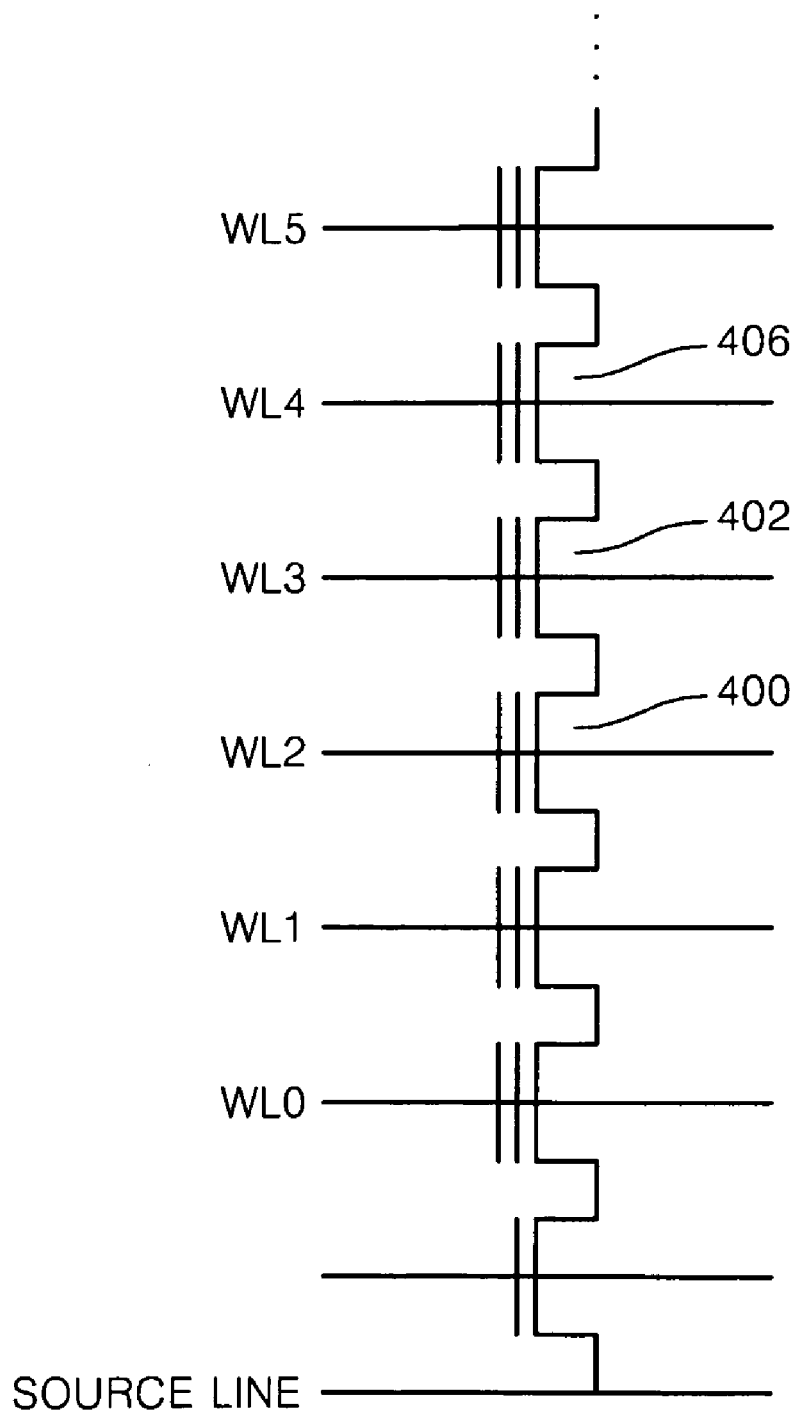
FIG. 15 is a circuit diagram illustrating a part of a NAND string in a block having multi-NAND strings.

FIG. 15 illustrates a part of a NAND string in a block having multiple-NAND strings. In FIG. 15, 5 memory cells are arranged in a NAND string. However, each of the NAND strings may include more memory cells.

Two memory cells are adjacent to a specific memory cell 400 in the same NAND string.

Memory cells in the same NAND string may be programmed in the following order in order to reduce a gate coupling effect between adjacent memory cells.

The specific memory cell 400 is programmed by using the first programming operation, a memory cell 402 adjacent to the specific memory cell 400 is programmed by using the first programming operation, and then the specific memory cell 400 is programmed by using the second programming operation. Next, a memory cell 406 adjacent to the memory cell 402 in opposite to the specific memory cell 400 is programmed by using the first programming operation, and then the memory cell 402 is programmed by using the second programming operation. Here, when a memory cell is programmed to an MLC, the second programming operation may include only an operation in which a plurality of verifying operations per one-time program voltage applying operation are performed as described with reference to FIGS. 13A through 14B, or both an operation in which one-time verifying operation per one-time program voltage applying operation is performed and an operation in which a plurality of verifying operations per one-time program voltage applying operation are performed.

Table 1 shows an order in which memory cells arranged in the same NAND string are programmed.

TABLE 1

| Word line | Programming operation | Order |
|---|---|---|
| W5 | Second | 13 |
|    | First  | 10 |
| W4 | Second | 11 |
|    | First  | 8  |
| W3 | Second | 9  |
|    | First  | 6  |
| W2 | Second | 7  |
|    | First  | 4  |
| W1 | Second | 5  |
|    | First  | 2  |
| W0 | Second | 3  |
|    | First  | 1  |

When the memory cell is programmed in the above order, a threshold voltage range of a memory cell which has been sufficiently narrowed after performing the second programming operation can be prevented from being widened again when adjacent memory cells are programmed. Thus, a narrowed threshold voltage distribution obtained by using at least the first programming operation and then the second programming operation can be maintained.

As described above, a method of programming a flash memory device according to example embodiments uses a process of consecutively performing a plurality of verifying operations per one-time program voltage applying operation Therefore, the flash memory cell can not be over-programmed due to a verifying error which may occur in a general ISPP method. Accordingly, the dispersion of a threshold voltage in a program state can be more efficiently reduced.

Accordingly, if the programming method of example embodiments is used, dispersions of threshold voltages of cells respectively corresponding to recording states may be reduced. Therefore, the recording states may be separately recognized in a multi-level cell operation.

Although example embodiments have been shown and described in this specification and figures, it would be appreciated by those skilled in the art that changes may be made to the illustrated and/or described example embodiments without departing from their principles and spirit.

What is claimed is:

1. A method of programming a memory device, the method comprising:
performing a first programming operation including a verifying operation using a first verifying voltage; and
performing a second programming operation including a verifying operation using a second verifying voltage that is greater than the first verifying voltage wherein a plurality of verifying operations per one-time program voltage applying operation are consecutively performed after a program voltage is applied to a memory cell,
wherein, in the first programming operation, a pair of operations including one-time program voltage applying operation and one-time verifying operation is repeatedly performed until the verifying operation using the first verifying voltage is passed, and
in the second programming operation, a pair of operations including one-time program voltage applying operation and a plurality of verifying operations is repeatedly performed until the verifying operation using the second verifying voltage is passed.

2. The method of claim 1, wherein the first verifying voltage is lower than the second verifying voltage within a range between about 0.2V and 1.0V.

3. The method of claim 1, wherein the second programming operation is performed on a memory cell that passes the verifying operation using the first verifying voltage.

4. The method of claim 3, wherein the first programming operation is performed on a memory cell in an erase state such that the memory cell in the erase state is programmed to an intermediate program state, and the second programming operation is performed on the memory cell in the intermediate program state such that the memory cell in the intermediate program state is programmed to a final program state.

5. The method of claim 4, wherein the memory cell after the final program state comprises three or more levels.

6. The method of claim 4, wherein the first programming operation is performed on a memory cell in an erase state such that the memory cell in the erase state is programmed to an intermediate program state, and
the second programming operation is performed on the memory cell in the intermediate program state such that the memory cell in the intermediate program state is programmed to a final program state to increase a minimum threshold voltage of the intermediate program state and reduce a threshold voltage distribution range.

7. The method of claim 6, wherein the memory cell is a 4-level cell, the erase state is a "11" state, and the final program state is at least one of a "01" state, a "00" state, and a "10" state.

8. The method of claim 6, wherein, in each of the first programming operation and the second programming operation, a pair of operations including a program voltage applying operation and a verifying operation is repeatedly performed with a progressive increase in a program voltage.

9. The method of claim 8, wherein a program voltage increment in each step in the second programming operation is lower than that in the first programming operation.

10. The method of claim 3, further comprising performing a third programming operation including a verifying operation using a verifying voltage that is lower than the first verifying voltage, in which a pair of operations including one-time program voltage applying operation and one-time verifying operation is repeatedly performed on a memory cell in an erase state until the verifying operation using the verifying voltage lower than the first verifying voltage is passed such that the memory cell in the erase state is programmed to an intermediate program state,
wherein the first programming operation and the second programming operation are sequentially applied to the memory cell in the intermediate program state such that the memory cell in the intermediate program state is programmed to a final program state to increase a minimum threshold voltage of the program state and reduce a threshold voltage distribution range.

11. The method of claim 10, wherein, in each of the third programming operation, the first programming operation, and the second programming operation, a pair of operations including a program voltage applying operation and a verifying operation is repeatedly performed with a progressive increase in a program voltage.

12. The method of claim 11, wherein a program voltage increment in each step in the second programming operation is lower than that in the first programming operation.

13. The method of claim 10, wherein the memory cell is a 4-level cell, the erase state is a "11" state, and the final program state is at least one of a "01" state, a "00" state, and a "10" state.

14. The method of claim 1, wherein the plurality of verifying operations are performed at intervals.

15. The method of claim 14, wherein the intervals are within a range between about 1 μs and 100 μs.

16. The method of claim 1, wherein the memory cell is one of a floating gate type memory cell and a charge trap type memory cell.

17. The method of claim 4, wherein the first programming operation is applied to a memory cell in an erase state such that the memory cell in the erase state is programmed to an intermediate program state that is a dummy state, the second programming operation is applied to the memory cell in the erase state such that the memory cell in the erase state is programmed to a first program state, and the second programming operation is applied to the memory cell in the dummy state such that the memory cell in the dummy state is programmed to a second or third program state.

18. The method of claim 17, wherein the memory cell is a 4-level cell, the erase state is a "11" state, and the first through third program states are a "01" state, a "00" state, and a "10" state and are different from one another.

19. The method of claim 17, wherein, in each of the first programming operation and the second programming operation, a pair of operations including a program voltage applying operation and a verifying operation is repeatedly performed with a progressive increase in a magnitude of a program voltage.

* * * * *